(12) United States Patent
D'Aquino et al.

(10) Patent No.: US 7,031,127 B1
(45) Date of Patent: Apr. 18, 2006

(54) SHORT CIRCUIT PROTECTION

(75) Inventors: Danny D'Aquino, Sunnyvale, CA (US); Mehmet Aslan, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 428 days.

(21) Appl. No.: 10/397,666

(22) Filed: Mar. 25, 2003

(51) Int. Cl.
*H02H 9/00* (2006.01)

(52) U.S. Cl. .................................................. 361/58

(58) Field of Classification Search ............... 361/58, 361/10, 11; 323/276
See application file for complete search history.

(56) References Cited

U.S. PATENT DOCUMENTS

| | | | | | |
|---|---|---|---|---|---|
| 3,512,098 | A | * | 5/1970 | Jack | 330/290 |
| 4,096,398 | A | * | 6/1978 | Khaitan | 326/70 |
| 4,612,497 | A | * | 9/1986 | Ulmer | 323/315 |
| 5,012,128 | A | * | 4/1991 | Chan | 327/112 |
| 5,696,658 | A | * | 12/1997 | Pietrobon | 361/31 |
| 5,973,563 | A | * | 10/1999 | Seven | 330/265 |
| 6,097,582 | A | * | 8/2000 | John et al. | 361/79 |
| 6,154,094 | A | * | 11/2000 | Seven | 330/252 |
| 2005/0162189 | A1 | * | 7/2005 | Tanabe | 326/82 |

OTHER PUBLICATIONS

Sedra et al., "Microelectronic Circuits", Third Edition, pp. 677-678, 1991.

* cited by examiner

*Primary Examiner*—Brian Sircus
*Assistant Examiner*—Boris Benenson
(74) *Attorney, Agent, or Firm*—Darby & Darby PC; Matthew M. Gaffney

(57) ABSTRACT

Output current of an amplifier is limited by clamping the voltage at the gate of one or more of the transistors in the output stage. A drive signal is provided to the gate of a p-type transistor in an example output stage. Another p-type transistor is activated in a short-circuit protection circuit when the drive signal is below a pre-determined level, whereby the short-circuit protection circuit is activated to clamp the drive signal. Similarly, an n-type transistor in another short-circuit protection circuit may be configured to clamp another drive signal for an n-type output stage. The short-circuit protection methodology may be applied to output stages such as in class A and class AB amplifiers.

20 Claims, 7 Drawing Sheets

SHORT CIRCUIT PROTECTION

FIELD OF THE INVENTION

The present invention relates to the field of short circuit protection, and, in particular, to a CMOS short circuit protection circuit that provides short-circuit protection to an output stage of a class AB or class A amplifier.

BACKGROUND OF THE INVENTION

A class AB amplifier includes a differential amplifier, a push-pull output stage, and a AB bias circuit. The push-pull output stage includes a p-type transistor and an n-type transistor that drive a signal to an output. The class AB bias circuit is configured to bias the push-pull output stage.

Accidental short-circuiting of the output is a problem for class AB amplifiers. If the output of the amplifier is accidentally shorted to ground, then the gate of the p-type transistor decreases in voltage, causing a significant increase in the output current. Similarly, if the output of the amplifier is accidentally shorted to the supply voltage, then the gate of the n-type transistor increases in voltage, causing a significant increase in the output current. The increased output current caused by the short circuit may damage the differential amplifier.

DETAILED DESCRIPTION OF THE PREFERRED EMBODIMENT

Figure 1:
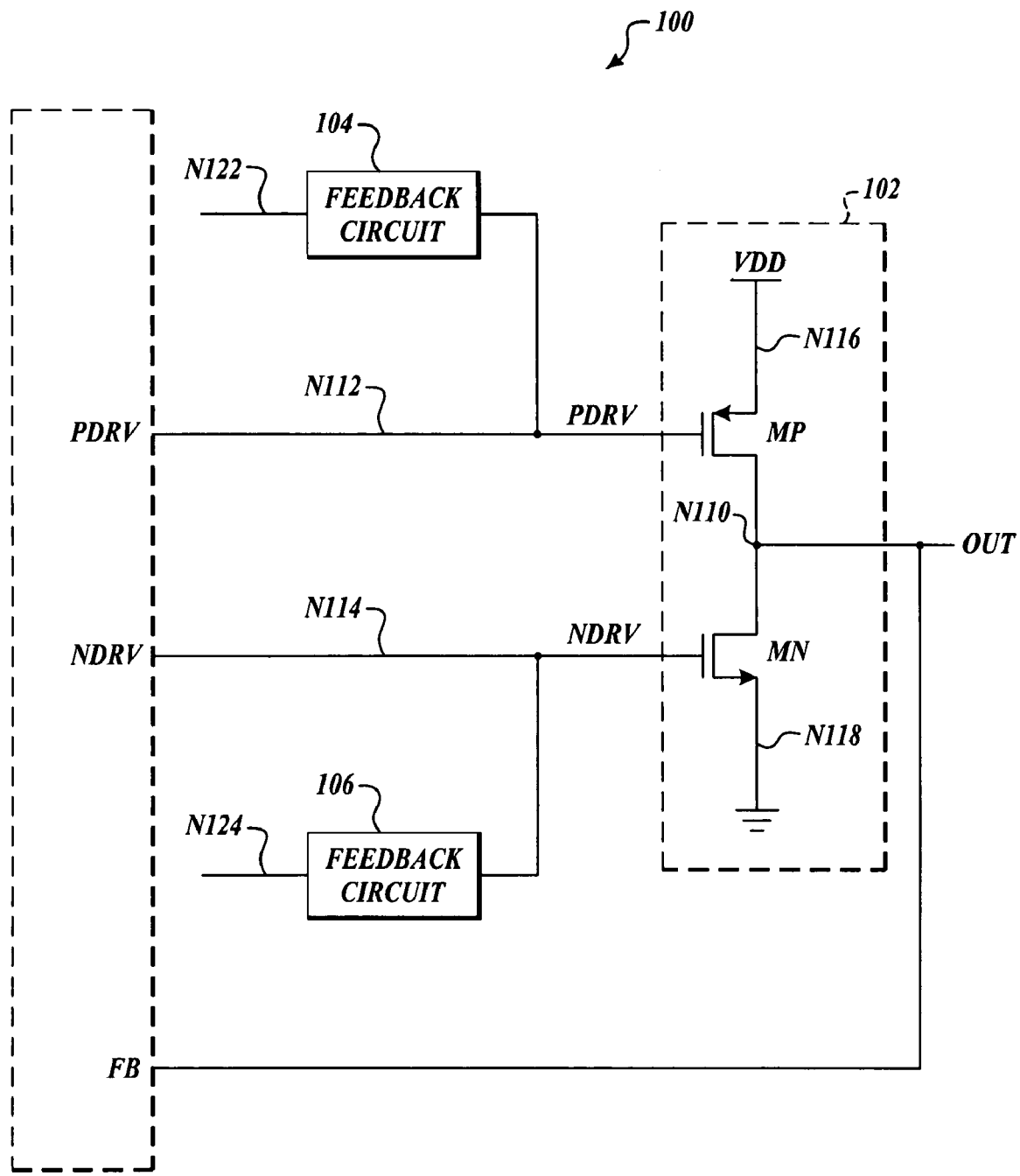
FIG. 1 illustrates an example push-pull stage with short circuit protection.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, or data signal. Referring to the drawings, like numbers indicate like parts throughout the views.

The invention is related to a short-circuit protection circuit for an amplifier. Output current of the amplifier is limited by clamping the voltage at the gate of one or more of the transistors in the output stage. A drive signal is provided to the gate of a p-type transistor in an example output stage. Another p-type transistor is activated in a short-circuit protection circuit when the drive signal is below a pre-determined level, whereby the short-circuit protection circuit is activated to clamp the drive signal. Similarly, an n-type transistor in another short-circuit protection circuit may be configured to clamp another drive signal for an n-type output stage. The short-circuit protection methodology may be applied to output stages such as in class A and class AB amplifiers.

FIG. 1 illustrates an example circuit (100) including a push-pull stage with short circuit protection, arranged in accordance with aspects of the present invention. Circuit 100 includes push-pull output stage 102, short circuit protection circuit 104, and short circuit protection circuit 106. Short circuit protection circuit 104 will be referred to interchangeably as short circuit protection circuit 104 or feedback circuit 104 herein. Similarly, short protection circuit 106 will be referred to interchangeably as short circuit protection circuit 106 of feedback circuit 106 herein. Push-pull output stage 102 includes transistor MP and transistor MN.

Transistor MP has a drain that is coupled to node N110, a gate that is coupled to node N112, and a source that is coupled to node N116. Transistor MN has a drain that is coupled to node N110, a gate that is coupled to node N114, and a source that is coupled to node N118. Short protection circuit 104 has a first port that is coupled to node N112 and a second port that is coupled to node N122. Short circuit protection circuit 106 has a first port that is coupled to node N114 and a second port that is coupled to node N124. Node N110 is connected in a feedback arrangement, such that circuit 100 is arranged for closed loop operation.

In operation, circuit 100 operates as follows. A ground signal is supplied to node N118, and a supply signal is supplied to node N116. Push-pull output stage 102 is a push-pull stage of an amplifier circuit. Push-pull output stage 102 is configured to produce an output signal at node N110 in response to signal PDRV at node N112 and signal NDRV applied at node N114.

Short circuit protection circuit 104 is configured to provide short circuit protection when node N110 is shorted to ground. For closed loop operation, there is feedback from signal OUT to an input of the amplifier circuit. The gate of transistor MP is configured to receive signal PDRV. The voltage associated with signal PDRV will decrease during closed operation when node N110 is shorted to ground, which could produce a large current in signal OUT, possibly damaging other components in the circuit. Short circuit protection circuit 104 is configured to prevent the voltage associated with signal PDRV from decreasing below a first pre-determined voltage level, thereby clamping the current associated with signal OUT. Short circuit protection circuit 104 is configured to cause the voltage at node N112 to increase when short circuit protection circuit 104 senses that the voltage associated with the first signal is below the first pre-determined voltage level. Short circuit protection circuit 104 thus clamps the voltage associated with signal PDRV through negative feedback.

Short circuit protection circuit 106 is configured to provide short circuit protection when node N110 is shorted to the supply voltage. The gate of transistor MN is configured to receive signal NDRV. The voltage associated with signal NDRV increases during closed loop operation when node N110 is shorted to the supply voltage. Short circuit protection circuit 106 is configured to prevent the voltage associated with signal NDRV from increasing beyond a second pre-determined voltage level. Short circuit protection circuit 106 causes the voltage at node N114 to decrease when short circuit protection circuit 106 senses that the voltage associated with signal NDRV exceeds the second pre-determined voltage level. Short circuit protection circuit 106 thus clamps the voltage associated with signal NDRV through negative feedback.

In one example, circuit 100 may include short circuit protection circuit 104 without short circuit protection circuit 106, when it is only necessary to protect class AB amplifier circuit 200 against node N110 shorting to ground. In another example, circuit 100 may include short circuit protection circuit 106 without short circuit protection circuit 104, when it is only necessary to protect class AB amplifier circuit 200 against node N110 being shorted to the supply voltage. In another example, circuit 100 may include both short circuit protection circuit 104 and short circuit protection circuit 106, when it is desired to protect against node N110 shorting to either the supply voltage or ground.

FIG. 1 illustrates an example in which a short circuit protection circuit (104 or 106) is used to clamp the voltage associated a gate of one of the transistor in a push-pull stage (102). Alternatively, a short circuit protection circuit (104 or 106) may be used to clamp the voltage associated with the gate of an output transistor in an output stage of a class A amplifier.

According to the example shown in FIG. 1, short circuit protection circuit 104 detects the voltage at node N112, and adjusts the voltage at node N122. Node N122 may be identical to node N112. Alteratively, node N122 may be related to node N112 such that adjusting the voltage at node N122 causes a corresponding adjustment in the voltage at node N112. According to the example shown in FIG. 1, short circuit protection circuit 106 detects the voltage at node N114, and adjusts the voltage at node N124. Node N124 may be identical to node N114. Alternatively, node N124 may be related to node N114 such that adjusting the voltage at node N124 causes a corresponding adjustment in the voltage at node N114.

Figure 2:
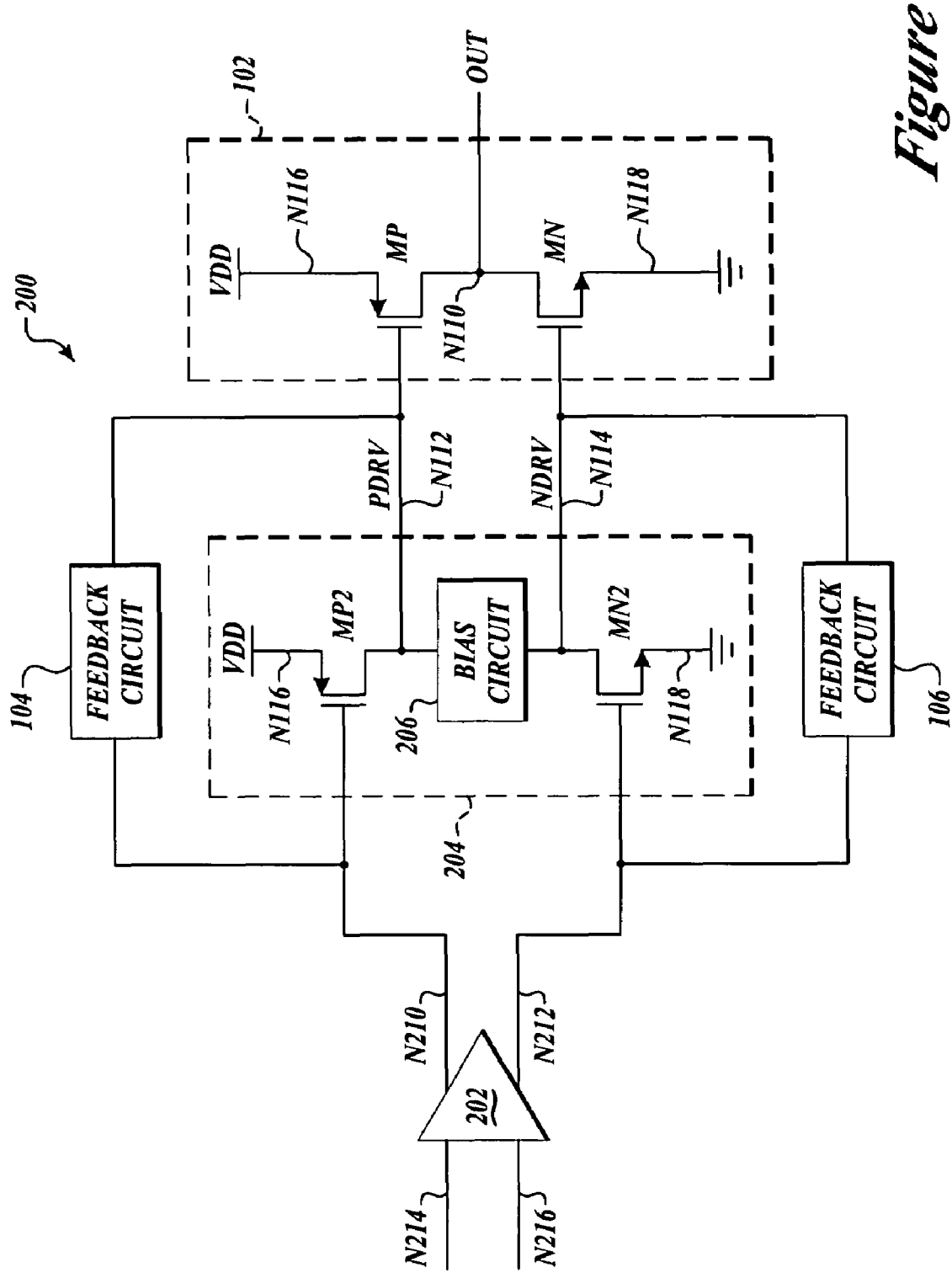
FIG. 2 illustrates an example class AB amplifier circuit with short circuit protection.

FIG. 2 illustrates an example class AB amplifier circuit (200) with short circuit protection, arranged in accordance with aspects of the present invention. Class AB amplifier circuit 200 includes differential amplifier circuit 202, class AB bias circuit 204, push-pull output stage 102, short circuit protection circuit 104, and short circuit protection circuit 106. Push-pull output stage 102 includes transistor MP and transistor MN. Class AB bias circuit 204 includes transistor MP2, transistor MN2, and bias circuit 206.

Differential amplifier circuit 202 has a first input that is coupled node N214, a second input that is coupled to node N216, a first output that is coupled to node N210, and a second output that is coupled to node N212. Transistor MN has a drain that is coupled to node N110, a gate that is coupled to node N114, and a source that is coupled to node N118. Transistor MP has a drain that is coupled to node N110, a gate that is coupled to node N112, and a source that is coupled to node N116. Short protection circuit 104 has a first port that is coupled to node N112 and a second port that is coupled to node N210. Short circuit protection circuit 106 has a first port that is coupled to node N114 and a second port that is coupled to node N212. Transistor MP2 has a gate that is coupled to node N210, a source that is coupled to node N116, and a drain that is coupled to node N112. Transistor MN2 has a gate that is coupled to node N212, a source that is coupled to node N118, and a drain that is coupled to node N114.

In operation, a ground signal is supplied to node N118 and a supply signal is supplied to node N116. Push-pull output stage 102 is an output stage of class AB amplifier circuit 200. Push-pull output stage 102 is configured to produce an output signal (OUT) at node N110 in response to signal PDRV applied at node N112 and signal NDRV applied at node N114. Differential amplifier circuit 202 is configured to produce a differential output at nodes N210 and N212 in response to a differential input that is received at nodes N214 and N216.

Figure 6:
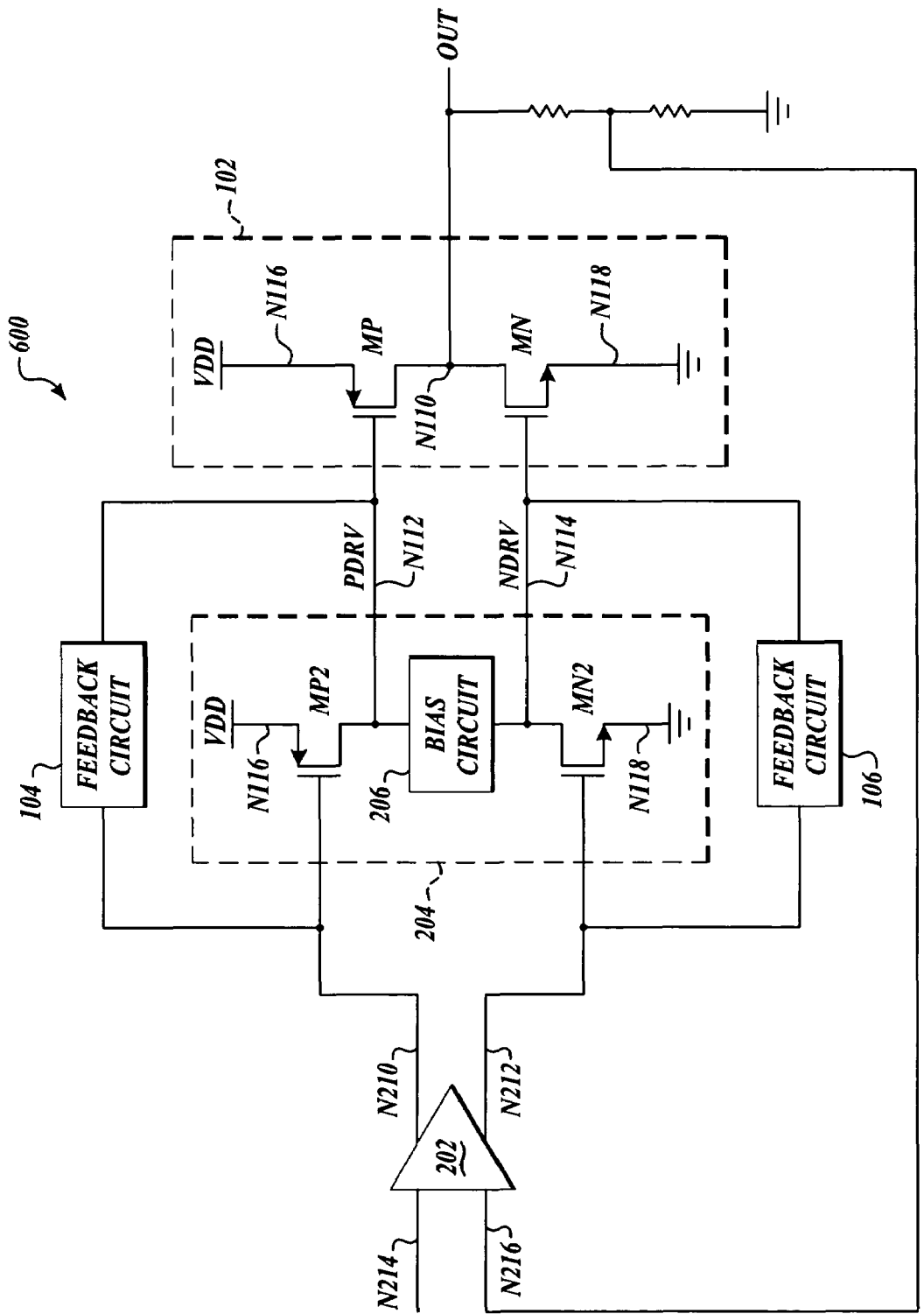
FIG. 6 illustrates an embodiment of the class AB amplifier circuit of FIG. 2 with an example feedback path for closed loop operation, arranged in accordance with aspects of the present invention.

Short circuit protection circuit 104 is configured to provide short circuit protection to circuit 200 when the node N110 is shorted to ground and the circuit has feedback from signal OUT to the inputs. One embodiment of such a feedback path is illustrated in FIG. 6. The gate of transistor MP is configured to receive signal PDRV. The voltage associated with signal PDRV decreases when node N110 is shorted to ground. Short circuit protection circuit 104 is configured to prevent the voltage associated with signal PDRV from decreasing below a first pre-determined voltage level. Short circuit protection circuit 104 is configured to cause the voltage at node N210 to decrease when short circuit protection circuit 104 senses that the voltage associated with signal PDRV is below the first pre-determined voltage level. Transistor MP2 is configured such that a decrease in the voltage at node N210 causes an increase in the voltage at node N112. Short circuit protection circuit 104 clamps the voltage of PDRV through negative feedback. Short circuit protection circuit 104 is configured such that it does not affect class AB amplifier circuit 200 during normal operating conditions.

Class AB bias circuit 204 is configured to bias push-pull output stage 102. Class AB bias circuit 204 also limits the total current on that branch.

According to one example, class AB amplifier circuit 200 is configured to operate with a supply voltage of approximately 3 V. For this example, there is a maximum output voltage of 2.5 V, with approximately 500 mV of headroom for transistor MP. According to one example, short circuit protection circuit 104 is configured to provide short circuit protection against accidental shorting of signal OUT to ground, operating within the constraint of having 500 mV or less of headroom for transistor MP.

Short circuit protection circuit 106 is configured to provide short circuit protection when the node N110 is shorted to the supply voltage. The gate of transistor MN is configured to receive signal NDRV. The voltage associated with signal NDRV increases when node N110 is shorted to the supply voltage. Short circuit protection circuit 106 is configured to prevent the voltage associated with signal NDRV from increasing beyond a second pre-determined current level. Short circuit protection circuit 106 is configured to cause the voltage at node N212 to increase when short circuit protection circuit 106 senses that the voltage associated with signal NDRV exceeds the second pre-determined current level. Transistor MN2 is configured such that an increase in the voltage at node N212 causes a decrease in voltage at node N114. Short circuit protection circuit 106 clamps the voltage associated with signal NDRV through negative feedback.

In one example, class AB amplifier circuit 200 may include short circuit protection circuit 104, without short circuit protection circuit 106, when it is only necessary to protect against node N110 being shorted to ground. In another example, class AB amplifier circuit 200 may include short circuit protection circuit 106 without short circuit protection circuit 104, when it is only necessary to protect against node N110 being shorted to the supply voltage. In another example, class AB amplifier circuit 200 may include both short circuit protection circuit 104 and short circuit protection circuit 106, when it is desired to protect against node N110 shorting to either the supply voltage or ground.

Figure 3:
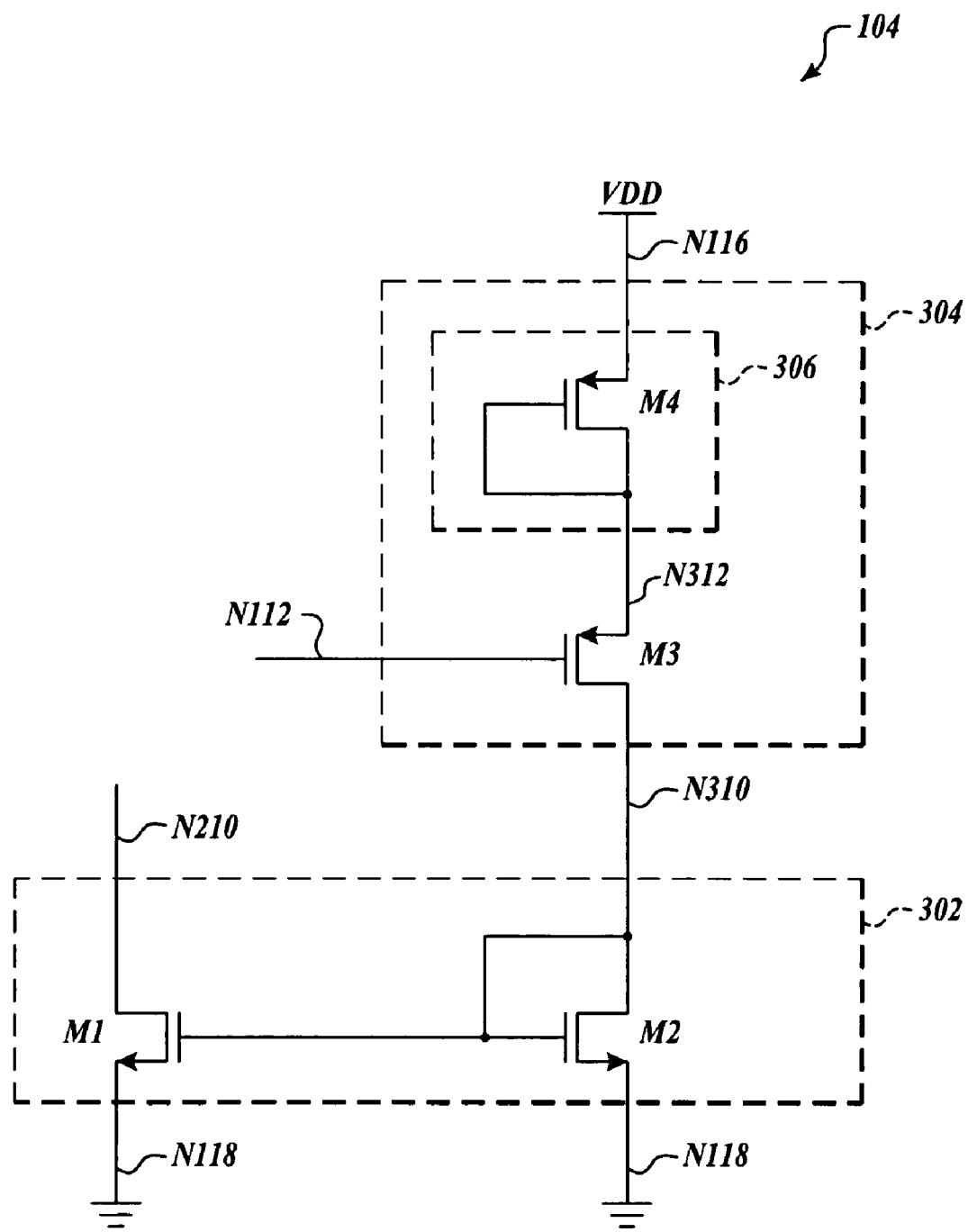
FIG. 3 illustrates an example short circuit protection circuit.

FIG. 3 illustrates short circuit protection circuit 104, arranged in accordance with aspects of the present invention. Short circuit protection circuit 104 includes current mirror 302 and sensing circuit 304. An example current mirror 302 includes transistor M1 and transistor M2. An example sensing circuit 304 includes transistor M3 and clamping circuit 306. An example clamping circuit 306 includes transistor M4.

Transistor M1 has a gate that is coupled to node N310, a source that is coupled to node N118, and a drain that is coupled to node N210. Transistor M2 has a gate that is coupled to node N310, a source that is coupled to node N118, and a drain that is coupled to node N310. Transistor M3 has a gate that is coupled to node N112, a source that is coupled to node N312, and a drain that is coupled to node N310. Transistor M4 has a gate that is coupled to node N312, a source that is coupled to node N116, and a drain that is coupled to node N312.

FIG. 3 illustrates short circuit protection circuit 104, along with its connections for class AB amplifier circuit 200.

Briefly stated, short circuit protection circuit 104 is configured to limit the voltage associated with signal PDRV at node N112. Short circuit protection circuit 104 causes the voltage at node N210 to decrease when short circuit protection circuit 104 senses that the voltage associated with the signal PDRV decreases below the first pre-determined voltage level.

Sensing circuit 304 is configured to evaluate whether the voltage associated with signal PRDV drops below the first pre-determined current level. Transistor M3 is configured to activate when the voltage associated with signal PDRV drops below the pre-determined voltage level. Clamping circuit 306 adjusts the voltage level that is required for transistor M3 to activate. Transistor M3 is configured to be inactive during normal operating conditions, such that short circuit protection circuit 104 does not affect the operation class AB amplifier circuit 200.

Current mirror 302 is configured to decrease the voltage at node N210 when transistor M3 is active. Transistor MP2 is configured to increase the voltage associated with signal PDRV at node N112 when the voltage at node N210 decreases. Thus, short circuit protection circuit 104 limits the voltage associated with signal PDRV through negative feedback.

FIG. 3 illustrates one example of current mirror 302. Other current mirrors could be used instead of the current mirror illustrated. FIG. 3 also illustrates an example of clamping circuit 306 including a transistor (M4) that is configured as a diode. Transistor M3 requires approximately two thresholds to activate when clamping circuit 306 consists of one diode. Other examples of clamping circuit 306 may be used. According to one example, clamping circuit 306 comprises a controlled current source. According to another example, clamping circuit 306 comprises two or more transistors coupled in series, where each transistor is configured as a diode. According to another example, clamping circuit 306 comprises a transistor having a gate that is coupled to a bias node. According to another example, clamping circuit 106 comprises one or more resistors.

The transistors in current mirror 302 (e.g. M1 and M2) may be sized to adjust the amount of current that is produced at node N210 when transistor M3 activates. The transistor in current mirror 302 may be sized to produce a small current when transistor M3 turns on, so that transistor M3 will require a greater voltage in order to produce a significant clamping effect. Alternative, current mirror 302 may be sized to amplify the current that is produced at node N310 when transistor M3 activates, so that a strong clamping effect is produced immediately when transistor M3 activates. Current mirror 302 may be a one-to-one current mirror. Alternatively, current mirror 302 may be sized at a ratio other than one-to-one.

Figure 4:
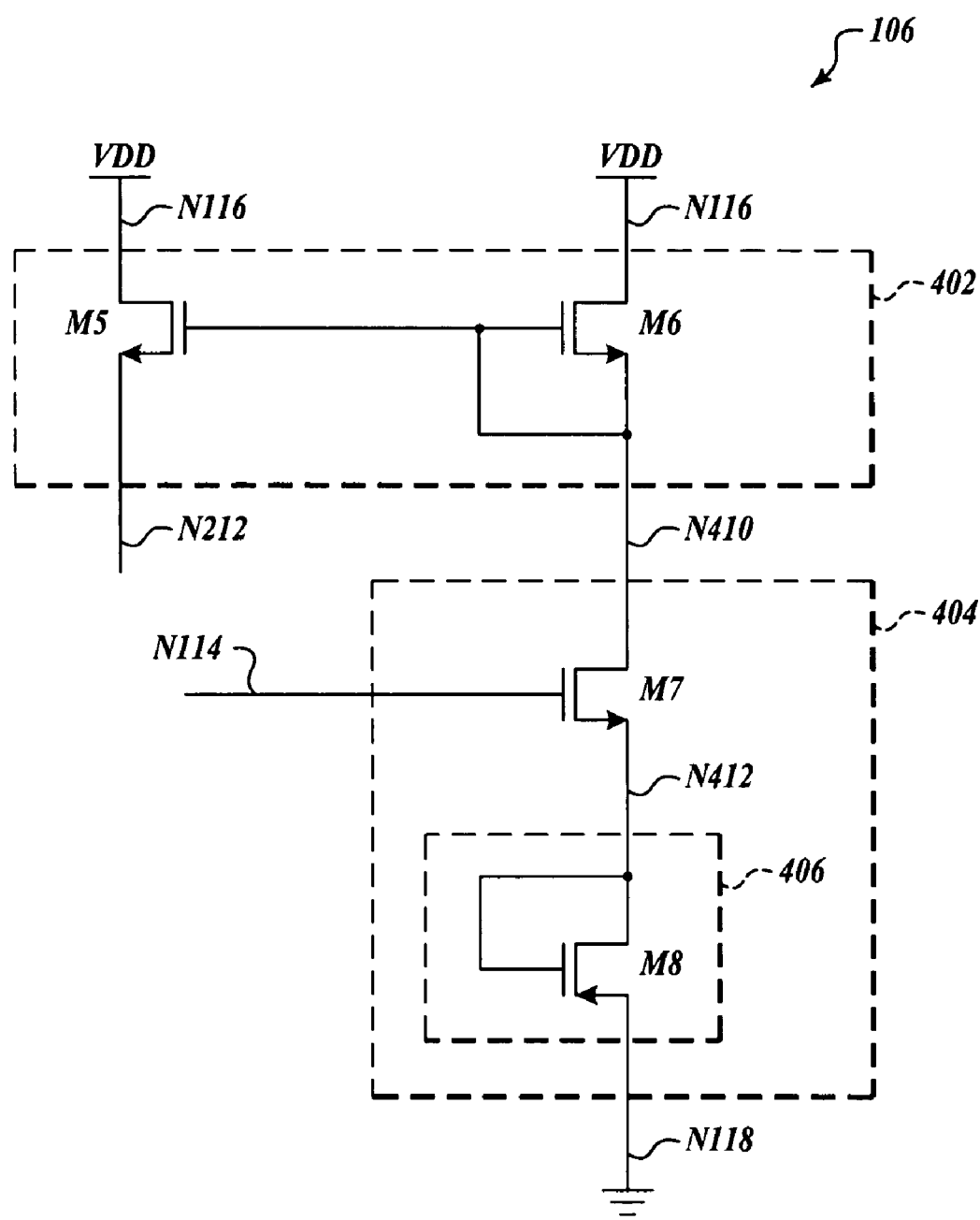
FIG. 4 illustrates another example short circuit protection circuit.

FIG. 4 illustrates short circuit protection circuit 106, arranged in accordance with aspects of the present invention. Short circuit protection circuit 106 includes current mirror 402 and sensing circuit 404. An example current mirror 402 includes transistor M5 and transistor M6. An example sensing circuit 404 includes transistor M7 and clamping circuit 406. An example clamping circuit 406 includes transistor M8.

Transistor M5 has a gate that is coupled to node N410, a source that is coupled to node N116, and a drain that is coupled to node N212. Transistor M6 has a gate that is coupled to node N410, a source that is coupled to node N116, and a drain that is coupled to node N410. Transistor M7 has a gate that is coupled to node N114, a source that is coupled to node N412, and a drain that is coupled to node N410. Transistor M8 has a gate that is coupled to node N412, a source that is coupled to node N118, and a drain that is coupled to node N412.

FIG. 4 illustrates short circuit protection circuit 106, along with its connections for class AB amplifier circuit 200.

Briefly stated, short circuit protection circuit 106 is configured to limit the voltage associated with node N114, such that short circuit protection is provided when node N110 is shorted to node N116. Short circuit protection circuit 106 causes the voltage at node N212 to increase when short circuit protection circuit 106 senses that the voltage associated with signal NDRV exceeds the second pre-determined voltage level.

Sensing circuit 404 is configured to evaluate whether the voltage associated with signal NDRV exceeds the second pre-determined voltage level. Transistor M7 is configured to activate when the voltage associated with signal NDRV exceeds the second pre-determined voltage level. Clamping circuit 406 adjusts a voltage level that is required for transistor M7 to activate.

Current mirror circuit 402 is configured to increase the voltage at node N212 when transistor M7 is active. Transistor MN2 is configured to lower the voltage at node N114 when the voltage at node N212 is increased. Thus short circuit protection circuit 106 limits the voltage associated with signal NDRV through negative feedback.

FIG. 4 illustrates one example of current mirror 402. Other current mirrors could be used instead of the current mirror illustrated. FIG. 4 also illustrates an example of clamping circuit 406 including a transistor that is configured as a diode. Other types of clamping circuits may be used. According to one example, clamping circuit 406 comprises a controlled current source. According to another example, clamping circuit 406 comprises two or more transistors coupled in series, where each transistor is configured as a diode. According to another example, clamping circuit 406 comprises a transistor having a gate that is coupled to a bias node. According to another example, clamping circuit 106 comprises one or more resistors.

According to one example, class AB amplifier circuit 200 is configured to operate with a supply voltage of approximately 3 V. For this example, there is a maximum output voltage of 2.5 V at the output signal (OUT), with approximately 500 mV of headroom for transistor MP. According to one example, class AB amplifier circuit 200 comprises clamping circuit 306 comprising a transistor (M4) configured as a diode, and further comprising clamping circuit 406 comprising one transistor (M8) configured as a diode that is coupled in series with another transistor (not shown) that is configured as a diode. The arrangement in which one diode is used for clamping circuit 306 and two diodes in series are used for clamping circuit 406 provides greater short circuit protection to transistor MP than transistor MN, which may be desirable when class AB amplifier circuit 200 is configured such that signal OUT operates at a voltage that is close to the supply voltage.

Figure 5A:
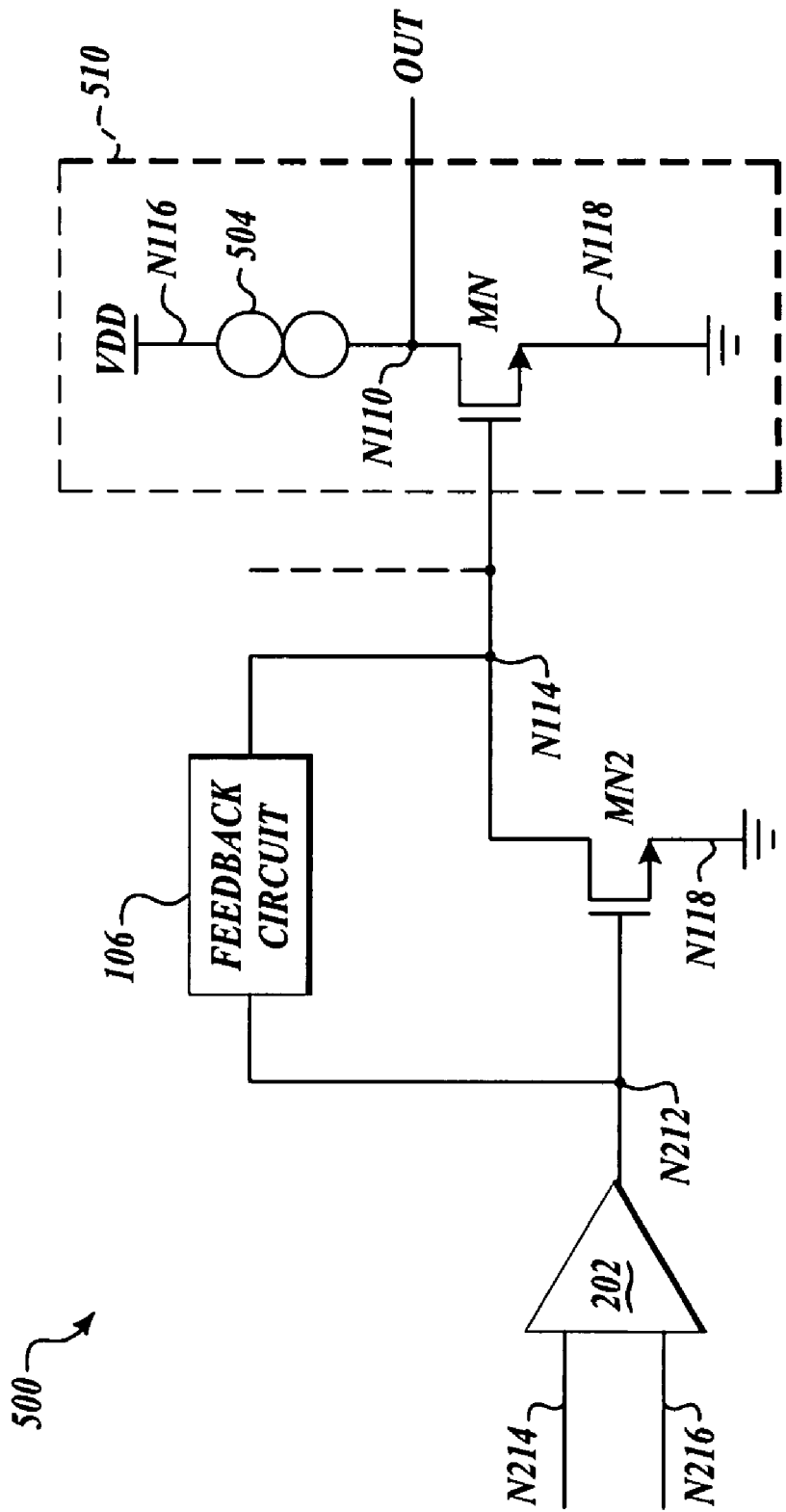
FIGS. 5A and 5B illustrate example class A amplifier circuits with short circuit protection.
Figure 5B:
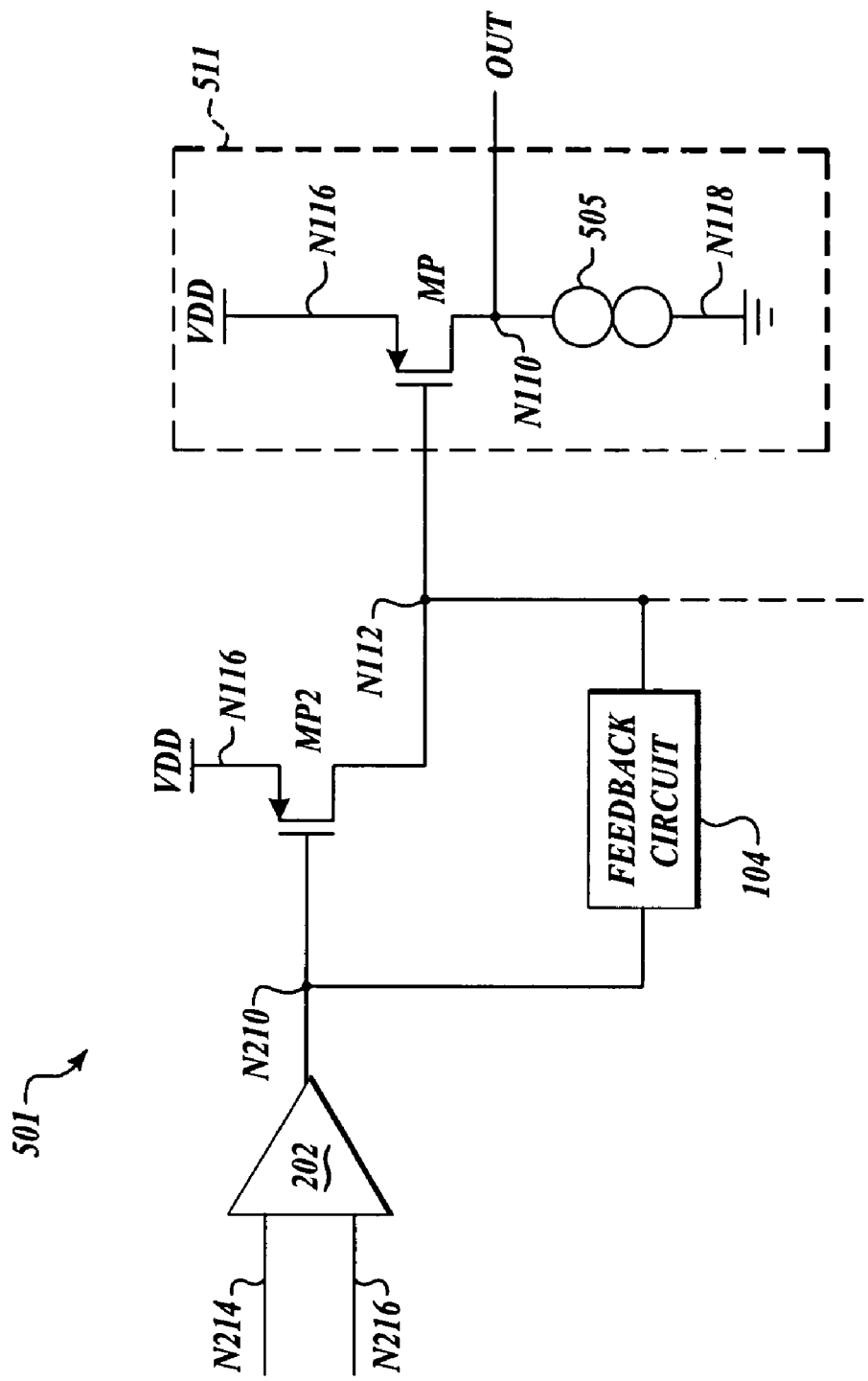

FIGS. 5A and 5B illustrate example class A amplifier circuits with short circuit protection. FIG. 5A illustrates a class A amplifier circuit (500) with short circuit protection that is arranged in accordance with aspects of the present invention. Class A amplifier circuit 500 includes differential amplifier 202, transistor MN2, short circuit protection circuit 106, and output stage 510. Output stage 510 includes transistor MN and current source 504.

Amplifier 202 has a first input that is coupled to node N214, a second input that is coupled to node N216, and an output that is coupled to node N212. Transistor MN2 has a gate that is coupled to node N212, a drain that coupled to node N114, and a source that is coupled to node N118. Short circuit protection circuit 106 has an input that is coupled to node N114 and an output that is coupled to node N212. Transistor MN has a gate that is coupled to node N114, a source that is coupled to node N118, and a drain that is coupled to node N110. Current source 504 is coupled between node N110 and node N116. According to one example, current source 504 comprises a transistor having a gate that is configured to receive a bias signal.

The short circuit protection that is provided in Class A amplifier circuit 500 operates in a similar manner to that described previously with respect to the class AB amplifier circuits illustrated in FIGS. 1–4. Transistor MN2 may be part of differential amplifier 202, or as part of an inverting gain stage that provides a drive signal to output stage 510.

FIG. 5B illustrates a class A amplifier circuit (501) with short circuit protection that is arranged in accordance with aspects of the present invention. Class A amplifier circuit 501 includes differential amplifier 202, transistor MP2, short circuit protection circuit 104, and output stage 511. Output stage 511 includes transistor MP and current source 505.

Amplifier 202 has a first input that is coupled to node N214, a second input that is coupled to node N216, and an output that is coupled to node N210. Transistor MP2 has a gate that is coupled to node N210, a drain that coupled to node N112, and a source that is coupled to node N116. Short circuit protection circuit 104 has an input that is coupled to node N112 and an output that is coupled to node N210. Transistor MP has a gate that is coupled to node N112, a source that is coupled to node N116, and a drain that is coupled to node N110. Current source 505 is coupled between node N110 and node N118. According to one example, current source 505 comprises a transistor having a gate that is configured to receive a bias signal.

The short circuit protection that is provided in Class A amplifier circuit 501 operates in a similar manner to that described previously with respect to the class AB amplifier circuits illustrated in FIGS. 1–4. Transistor MP2 may be part of differential amplifier 202, or as part of an inverting gain stage that provides a drive signal to output stage 511.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A circuit for short circuit protection comprising:
  a first transistor having a gate that is configured to receive an input signal of the short circuit protection circuit, wherein the first transistor is configured to activate when a voltage associated with the input signal reaches a first pre-determined voltage level;
  a clamping circuit that is coupled to a source of the first transistor, the clamping circuit being configured to adjust the first pre-determined voltage level; and
  a current mirror circuit that is coupled to a drain of the first transistor, the current mirror circuit being configured to adjust an output signal of the short circuit protection circuit when the voltage associated with the input signal exceeds the first pre-determined voltage level.

2. The circuit as in claim 1, the clamping circuit comprising at least one of a current source, a first diode, a second diode that is series coupled to the first diode, and a resistor.

3. The circuit as in claim 1, the clamping circuit comprising a second transistor that is configured to operate as at least one of a current source, a diode, and a resistor.

4. The circuit as in claim 1, the clamping circuit comprising a second transistor and a third transistor, wherein the second transistor is configured as a diode, the third transistor is configured as another diode, and wherein the third transistor is coupled in series with the second transistor.

5. The circuit as in claim 1, the first transistor being configured to sense a first signal from a gate of a PMOS transistor of an output stage, and the current mirror circuit being configured to clamp the voltage associated with the output signal of the short circuit protection circuit when a voltage associated with the first signal is below the first pre-determined voltage level.

6. The circuit as in claim 1, the first transistor being configured to sense a second signal at a gate of an NMOS transistor of an output stage, and the current mirror circuit being configured to clamp the voltage associated with the output signal of the short circuit protection circuit when a voltage associated with the second signal is above the pre-determined voltage level.

7. An amplifier circuit with short circuit protection comprising:
  a differential amplifier circuit having first and second inputs that are configured to receive a differential input signal;
  an output stage comprising an output transistor, the output transistor having a gate that is configured to receive a first signal, and a drain that is coupled to the differential amplifier circuit such that the amplifier circuit is arranged in closed loop operation; and
  a first short circuit protection circuit that is responsive to the first signal, comprising:
    a first transistor having a gate that is coupled to the gate of the output transistor;
    a first clamping circuit that is coupled to the source of the first transistor; and
    a first current mirror circuit having a first port that is coupled to a drain of the first transistor and a second port that is coupled to a first output of the differential amplifier.

8. The amplifier circuit as in claim 7, the first transistor being further configured to activate when a voltage associated with the first signal is above a first pre-determined voltage level, the first clamping circuit being configured to adjust the first pre-determined voltage level, and the first current mirror circuit being configured to increase the voltage at a first output of the differential amplifier circuit when the voltage associated with the first signal is above the first pre-determined voltage level.

9. The amplifier circuit as in claim 7, the first transistor being further configured to activate when a voltage associated with the first signal is below a first pre-determined voltage level, the first clamping circuit being configured to adjust the first pre-determined voltage level, and the first current mirror circuit being configured to decrease the voltage at a first output of the differential amplifier circuit when the voltage associated with the first signal is below the first pre-determined voltage level.

10. The amplifier circuit as in claim 7, the first transistor being further configured to activate when a voltage associated with the first signal is above a first pre-determined voltage level, the first clamping circuit being configured to adjust the first pre-determined voltage level, and the first current mirror circuit being configured to increase the voltage at a first output of the differential amplifier circuit when the voltage associated with the first signal is above the first pre-determined voltage level, wherein the output stage is a push-pull stage, the output transistor is a first NMOS transistor, the output stage further comprises a first PMOS transistor having a gate that is configured to receive a second signal and a drain that is coupled to the drain of the first NMOS transistor, and the amplifier circuit further comprises a class AB bias circuit having a first input that is coupled to the first output of the differential amplifier circuit, a second input that is coupled to a second output of the differential amplifier circuit, a first output that is coupled to the gate of the first PMOS transistor, and a second output that is coupled to the gate of the first NMOS transistor, the class AB bias circuit being configured to bias the push-pull stage.

11. The amplifier circuit as in claim 7, the first transistor being further configured to activate when a voltage associated with the first signal is above a first pre-determined voltage level, the first clamping circuit being configured to adjust the first pre-determined voltage level, and the first current mirror circuit being configured to increase the voltage at a first output of the differential amplifier circuit when the voltage associated with the first signal is above the first pre-determined voltage level, wherein the output stage is a push-pull stage, the output transistor is a first PMOS transistor, the output stage further comprises a first NMOS transistor having a gate that is configured to receive a second signal and a drain that is coupled to the drain of the first PMOS transistor, and the amplifier circuit further comprises a class AB bias circuit having a first input that is coupled to the first output of the differential amplifier circuit, a second input that is coupled to a second output of the differential amplifier circuit, a first output that is coupled to the gate of the first PMOS transistor, and a second output that is coupled to the gate of the first NMOS transistor, the class AB bias circuit being configured to bias the push-pull stage.

12. The amplifier circuit as in claim 7, the first clamping circuit comprising at least one of a current source, a first diode, a second diode that is series coupled to the first diode, and a resistor.

13. The amplifier circuit as in claim 7, the first clamping circuit comprising a second transistor that is configured to operate as at least one of a current source, a diode, and a resistor.

14. The amplifier circuit as in claim 7, the first clamping circuit comprising a second transistor and a third transistor, wherein the second transistor is configured as a diode, the third transistor is configured as another diode, and wherein the third transistor is coupled in series with the second transistor.

15. The amplifier circuit as in claim 7, wherein the output stage is configured for one of class A operation and class AB operation.

16. The amplifier circuit as in claim 11, further comprising a second short circuit protection circuit that is responsive to the second signal, comprising:
a fourth transistor having a gate that is coupled to the gate of the first NMOS transistor, wherein the fourth transistor is further configured to activate when the voltage associated with the second signal is below a second pre-determined voltage level;
a second clamping circuit that is coupled to the source of the fourth transistor, wherein the second clamping circuit is configured to adjust the second pre-determined voltage level; and
a second current mirror circuit having a first port that is coupled to a drain of the fourth transistor and a second port that is coupled to the first output of the differential amplifier circuit, wherein the second current mirror circuit is configured to increase the voltage associated with the second port of the second current mirror circuit when the voltage associated with the input signal is above the second pre-determined voltage level.

17. The amplifier circuit as in claim 16, the first clamping circuit comprising a fifth transistor that is configured as a diode, and the second clamping circuit comprising a sixth transistor that is configured as another diode.

18. The amplifier circuit as in claim 16, the first clamping circuit comprising a fifth transistor that is configured as a diode, the second clamping circuit comprising a sixth transistor and a seventh transistor, the sixth transistor being coupled in series with the seventh transistor, the sixth transistor being configured as a diode, and the seventh transistor being configured as another diode, and a class AB bias circuit comprising an eighth transistor and a ninth transistor, the eighth transistor having a gate that is coupled to the second port of the first current mirror, and a drain that is coupled to the gate of the first transistor, and the ninth transistor having a gate that is coupled to the second port of the second current mirror, and a drain that is coupled to the gate of the fourth transistor.

19. A method for an amplifier circuit in closed loop operation having an output stage with an output transistor, the method comprising:
evaluating a drive voltage that is associated with the gate of the output transistor;
determining when the drive voltage is within a pre-determined voltage range, wherein the pre-determined voltage range is associated with a high load condition on the output stage;
providing current in response to the drive voltage when the drive voltage is within the pre-determined voltage range; and
coupling the current to a node that is coupled to the gate of the output transistor such that the drive voltage is clamped when the drive voltage is within the pre-determined voltage range.

20. A circuit protection circuit for an amplifier circuit in closed loop operation having an output stage comprising an output transistor, the short circuit protection circuit comprising:
a means for evaluating that is configured to evaluate a drive voltage that is associated with the gate of the output transistor;

a means for determining that is configured to determine when the drive voltage is within a pre-determined voltage range, wherein the pre-determined voltage range is associated with a high load condition on the output stage;

a means for providing current that is configured to provide current in response to the drive voltage when the drive voltage is within the pre-determined voltage range; and a means for clamping that is configured to couple the current to a node that is coupled to the gate of the output transistor such that the drive voltage is clamped when the drive voltage is within the pre-determined voltage range.

\* \* \* \* \*

UNITED STATES PATENT AND TRADEMARK OFFICE
CERTIFICATE OF CORRECTION

| | | |
|---|---|---|
| PATENT NO. | : 7,031,127 B1 | Page 1 of 1 |
| APPLICATION NO. | : 10/397666 | |
| DATED | : April 18, 2006 | |
| INVENTOR(S) | : Dan D'Aquino et al. | |

It is certified that error appears in the above-identified patent and that said Letters Patent is hereby corrected as shown below:

In the Specification:

First Page Col. 2 (Attorney, Agent, or Firm), Line 1, Delete "PC;" and insert -- P.C.:--.

Column 1, Line 46, Delete "EMBODIMENT" and insert -- EMBODIMENTS --.

Column 3, Line 31 (Approx.), Delete "Alteratively, " and insert -- Alternatively,--.

Column 10, Line 54, In Claim 19, after "providing" insert -- a --.

Column 11, Line 7, In Claim 20, insert -- a -- before "current".

Signed and Sealed this

Twenty-ninth Day of August, 2006

JON W. DUDAS
*Director of the United States Patent and Trademark Office*